United States Patent [19]

Schoen

[11] Patent Number: 4,708,452

[45] Date of Patent: Nov. 24, 1987

[54] DECOATING DEVICE

[75] Inventor: Klaus-Peter Schoen, Wiesbaden, Fed. Rep. of Germany

[73] Assignee: Hoechst Aktiengesellschaft, Frankfurt am Main, Fed. Rep. of Germany

[21] Appl. No.: 930,525

[22] Filed: Nov. 14, 1986

[30] Foreign Application Priority Data

Nov. 15, 1985 [DE] Fed. Rep. of Germany ...... 3540588

[51] Int. Cl.$^4$ .............................................. G03D 5/04
[52] U.S. Cl. .................................... 354/317; 354/325; 355/10; 15/77; 118/684; 118/641
[58] Field of Search ............... 354/317, 324, 325, 299; 355/10; 15/77, 102; 118/682, 683, 684, 685, 641, 642

[56] References Cited

U.S. PATENT DOCUMENTS

| 3,621,772 | 11/1971 | Bogue | 354/317 |
| 4,068,251 | 1/1978 | Schroter et al. | 354/325 |
| 4,081,577 | 3/1978 | Horner | 354/325 X |
| 4,128,326 | 12/1978 | Selak | 354/317 |
| 4,334,755 | 6/1982 | Harrell et al. | 354/299 |
| 4,573,782 | 3/1986 | Kobayashi et al. | 354/325 |
| 4,627,698 | 12/1986 | Yamasaki et al. | 354/317 |

FOREIGN PATENT DOCUMENTS 0114402  8/1984  European Pat. Off. .
57-64740  4/1982  Japan .

Primary Examiner—A. A. Mathews
Attorney, Agent, or Firm—Schwartz, Jeffery, Schwaab, Mack, Blumenthal & Evans

[57] ABSTRACT

The decoating device 21 comprises a spraying section 22, a heating zone 9, a cleaning station 23 and a gumming station 24. Containers 5a, 5b, 5c for various developing liquids are connected via a multiway valve 5 to one or more flat-jet nozzles 6 in the spraying section 22. A first sensor 4 registers the incoming printing plate 1 and actuates the multiway valve 5 in order to admit decoating liquid from one of connected containers 5a, 5b or 5c to the flat-jet nozzle(s) 6. The decoating liquid sprayed past the printing plate 1 is conveyed via a collecting trough 7 into a collecting container 8. The thin film of decoating liquid on the printing plate 1 is heated to the preselected temperature by means of the radiator 25 in the heating zone 9. A pair of squeezing rollers 11 cleans the printing plate surface. A second sensor 14 registers the front edge of the printing plate 1 and then switches on the cleaning station 23 and gumming station 24 known per se. The rear edge of the printing plate 1 switches the decoating device 21 off via the second sensor 14. Shortly before the switching off, the flat-jet nozzles 6 are rinsed via a water connection 20 and the multiway valve 5 in order to prevent a clogging of the nozzle orifices.

19 Claims, 3 Drawing Figures

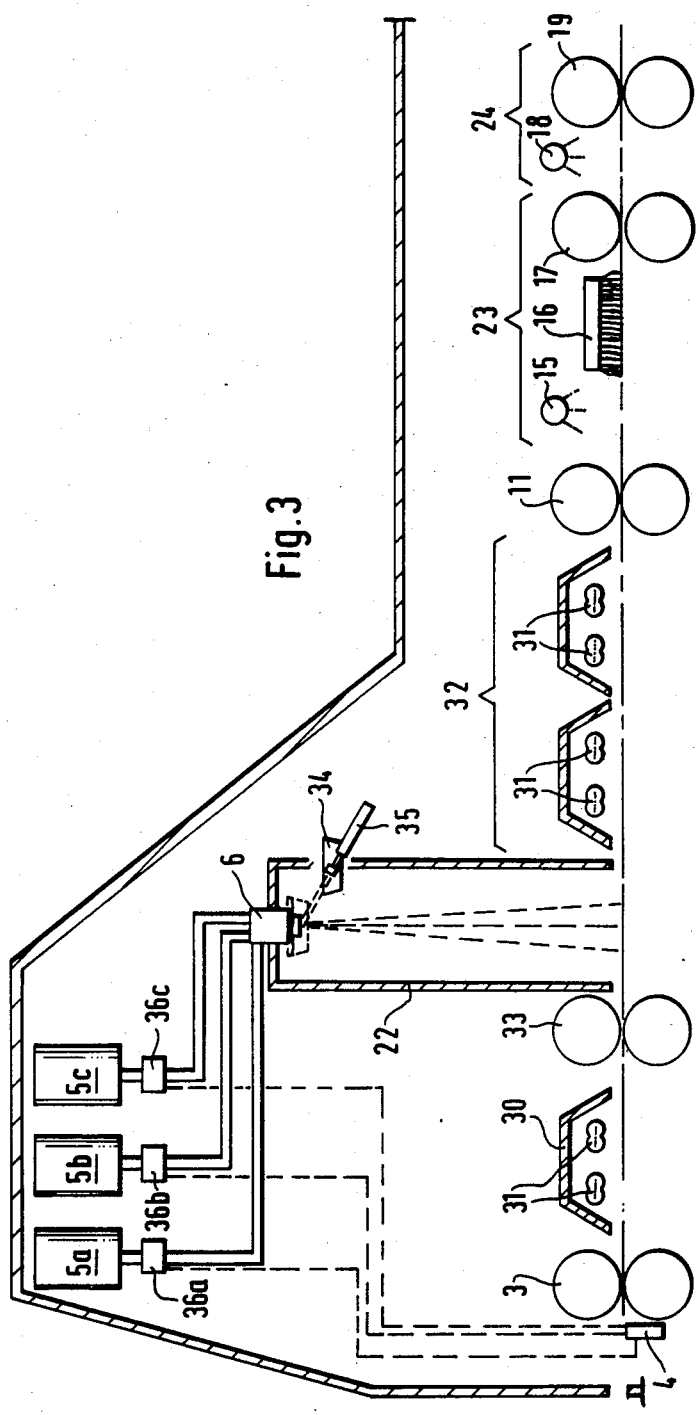

DECOATING DEVICE

BACKGROUND OF THE INVENTION

This invention relates to a decoating device, for precoated printing plates developed with liquid toner, having pairs of conveyor and squeezing rollers between which the printing plates pass, and having a spray device for spraying decoating liquid onto the developed surface of the individual printing plates.

Printing plate processing units of compact construction, as manufactured by KALLE Niederlassung der Hoechst AG, are known, by which printing plates are decoated or developed, rinsed, fixed/gummed and dried in one pass. In a decoating apparatus of the above type, the decoating agents and the rinsing water are kept in constant circulation by circulating pump units. Because of the closed circuits for the decoating liquid and the rinsing water, permanent connections to a water pipe and drain are unnecessary, so that the known decoating apparatus can be set up at any site. Other types of known printing plate processing units develop, rinse, fix/gum and dry the printing plates in one pass. These devices are, for example, fitted with an automatic topping-up system for the developer concentrate to stabilize the developer which circulates in a closed circuit inside the apparatus. The developer is cooled by a continuous water cooling system which is thermostatically monitored. The developer temperature is regulated by means of a thermostatically monitored developer heating system.

The processing of plates on the printing plate processing units is matched to the particular requirements by an independent speed adjustment for the plate pass and for the scrubbing elements such as, for example, brush rollers or plush-covered rollers.

It is common to the known printing plate processing units that a limited number of plates are decoated or developed with a specified quantity of decoating liquid. The number of printing plates is limited by saturation of the decoating liquid with coating residues. With increasing viscosity of the decoating solution, the pass speed of the printing plates has to be reduced in order to achieve satisfactory decoating or development. Also, although the decoating rate increases with rising temperature, limits are imposed on the temperature rise as a relatively large quantity of liquid has to be heated up, which requires a certain time. In addition, the risk of scalding through incorrect handling of the printing plates increases as a result of the higher temperatures of the decoating liquid. Because of the closed decoating liquid circuits in the known devices, printing plates which require different decoating or developing liquids for decoating or developing can only be processed after carrying out appropriate conversion work in each case.

SUMMARY OF THE INVENTION

It is an object of the present invention to provide a decoating device such that a constant quality of the decoating liquid is guaranteed for every printing plate without resolution losses while the pass velocity of the printing plates remains constant compared with the known decoating devices and so that printing plates with different light-sensitive coatings can be processed without converting the device.

In accomplishing this object, there has been provided in accordance with one aspect of the present invention a decoating device for precoated printing plates developed with liquid toner, comprising pairs of conveying and squeezing rollers between which the printing plates pass through and a spray device in a spraying section for spraying decoating liquid onto the developed surface of the individual printing plates, wherein the spray device comprises a plurality of containers, filled with different decoating liquids, with the decoating liquids being under pressure, at least one flat jet nozzle in a spraying section, the nozzle or nozzles being connected to the containers of decoating liquids via at least one valve, wherein a first sensor controls the opening times of the valves in accordance with the format of the printing plate passing through the decoating device, and wherein the spraying section is followed by a heating zone in which the decoating liquid film on the printing plate is heated to facilitate the decoating action.

Further objects, features and advantages of the present invention will become apparent from the detailed description of preferred embodiments which follows when considered together with the attached figures of drawings.

BRIEF DESCRIPTION OF THE DRAWINGS

The invention is described below in more detail by reference to the drawings.

In these:

FIG. 3 is a schematic sectional view of a further embodiment of the decoating device according to the invention.

DETAILED DESCRIPTION OF PREFERRED EMBODIMENTS

Figure 1:
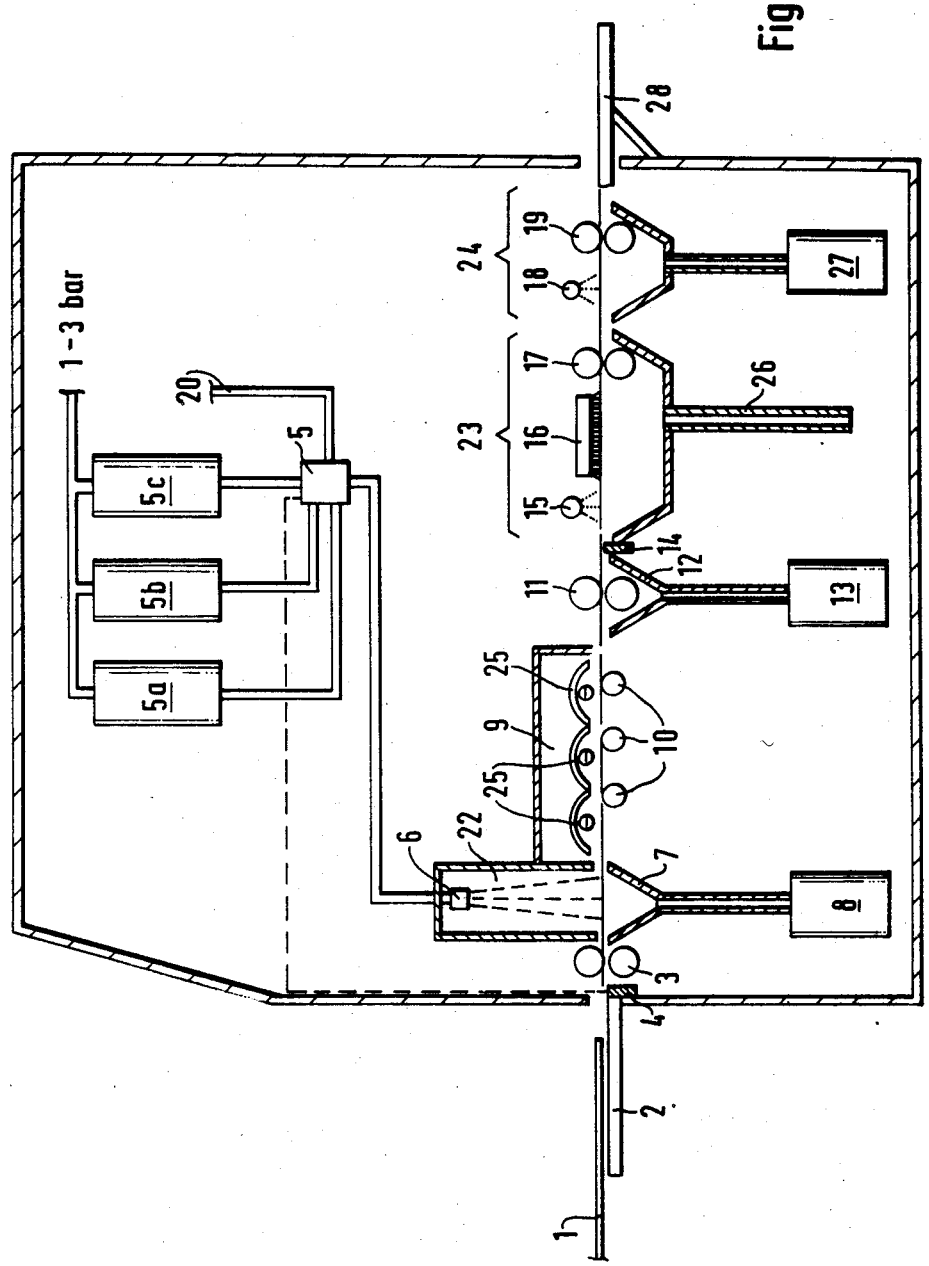
FIG. 1 is a schematic sectional representation of a first embodiment of a decoating device according to the invention.

According to the invention, a decoating device is provided wherein several containers are filled with diferent decoating liquids under pressure and each container is connected to at least one flat-jet nozzle in a spraying section via a valve, preferably a multiway valve, wherein a first sensor controls the opening times of the valve or valves in accordance with the format of the printing plate passing through and wherein the spraying section is followed by a heating zone in which the decoating liquid film is heated with the printing plate.

In one embodiment of the invention there is provided beneath the spraying section a trough for collecting the decoating liquid sprayed laterally across the printing plate, and for conveying this liquid to a collecting container connected to the trough.

In an expedient embodiment the multiway valve is connected to a water connection which supplies water via the multiway valve to the flat-jet nozzle for rinsing the jet orifices.

The invention achieves the advantages that a printing plate developed with liquid toner such as, for example, an Elfasol ® printing plate maintains the original quality of the toner image even after the decoating, and the results are reproducible with great precision and appropriate quality since each printing plate is treated with a defined quantity of fresh decoating liquid in each case. Since the decoating liquid is sprayed as a thin film of uniform thickness onto the surface of the printing plate, it can be brought to elevated temperature within a short time, as a result of which the decoating rate, as described above, is increased. It is consequently not necessary, as in the case of known decoating devices, to bring the entire stock of decoating solution to the elevated temperature, which obviously takes longer. Depending on the particular type of printing plate, an action zone of, for example, 50 cm for the elevated temperature of the decoating liquid and rates of advance of up to 3 m/min are possible. At the same time positive plates and electrophotographic printing plates such as, for example, Elfasol ® printing plates, require the decoating liquid to act for less time than negative plates.

Before the decoating device is explained more precisely in detail, some aspects of the decoating or the developing of printing plates are discussed.

Liquid toned electrophotographic printing plates in general exhibit a higher resolution than plates developed with dry toner. The toner image or the toner mask on the surface of the printing plate is resistant to aqueous alkaline solutions which form the basis of the decoating liquids. Toner layers can in general readily be decoated, but, depending on the degree of use of the decoating liquid, the danger exists of overdecoating or underdecoating of the toner image, in which case the image quality is not maintained. Qualitatively satisfactory decoating is only possible in a narrow range of process parameters. A certain overdecoating is in general desirable in order to compensate in advance for the dot increase in the case of a high print run of the printing plate, but underdecoating should be avoided if possible.

In order to maintain the quality of the toner image of a liqud toned printing plate such as, for example, an Elfasol ® plate or to achieve a slight overdecoating independently of the number of decoated printing plates, decoating with a defined quantity of decoating liquid in the form of a thin film and the one-time use of the decoating solution should be aimed at.

A diagrammatic representation of the construction of a decoating device 21 is shown in FIG. 1. A printing plate 1 which is to be decoated is slid over a loading table 2 into the roller gap of a conveyor roller pair 3. Before it reaches the roller gap, the front edge of the printing plate 1 actuates a first sensor 4 which is provided at the rear edge of the loading table 2. As soon as the first sensor 4 registers the front edge of the incoming printing plate 1, it delivers a signal to a multiway valve 5, for example, a magnetic multiway valve, which is switched on with a certain time delay. Connected to the multiway valve 5 are several containers 5a, 5b, 5c which are filled with various decoating liquids for various types of printing plate 1. The decoating liquid in the individual containers 5a, 5b, 5c is under a pressure between 1 to 3 bar. The output side of the multiway valve 5 is connected to at least one flat-jet nozzle 6 which is situated in a spraying section 22. The opening and closing times of the multiway valve 5 are controlled in accordance with the format of the printing plate 1 which is passing through, i.e., in accordance with the particular length of the printing plate 1 in the pass direction. When the front edge of the printing plate 1 opens the multiway valve 5 via the first sensor 4, the flat-jet nozzle 6 sprays, within the spraying section 22, the surface of the printing plate 1 which is passing through. Two to six flat-jet nozzles 6 may extend transversely to the pass direction of the printing plate 1 across the width of the printing plate. The number of flat-jet nozzles 6 depends on the processing width of the printing plate 1. The supply of the decoating liquid or solution to the flat-jet nozzle 6 is controlled by the multiway valve 5, filters (not shown) being connected between the containers 5a to 5c and the multiway valve 5 or between the latter and the flat-jet nozzle or nozzles 6 to filter out impurities in the decoating solution.

As soon as the rear edge of the printing plate 1 which is passing through passes the first sensor 4, the latter switches off the multiway valve 5 with a time delay. The multiway valve 5 is connected to a water connection 20 which, after the supply of decoating solution to the multiway valve 5 has been switched off, delivers water via the multiway valve 5 to the flat-jet nozzle 6 in order to rinse the nozzle orifices of the latter and consequently prevent them from clogging. Beneath the spraying section 22 there is a trough 7 for collecting decoating solution which is sprayed laterally across the printing plate 1 and which is conveyed from the rough to a collecting container 8 which is connected to the trough 7. The spraying section 22 is followed by a heating zone 9 in which the printing plate 1 and the film of decoating liquid or solution situated thereon are heated to a preselected temperature in the range from about 25° to 55° C. In the heating zone 9 five to twelve radiators with reflectors may be present to achieve the desired temperature. The number of radiators depends on the length of the desired heating zone, i.e., on the length of the action zone of the heated decoating liquid on the surface of the printing plate 1. In FIG. 1 three radiators 25 are shown. The temperature is regulated by means of a thermocouple (not shown) discretionally situated between the radiators 25 and the printing plate 1. In general it takes about 10 minutes for the radiators 25 of the heating zone 9 to heat up sufficiently to assume a stable operating state. The power consumption is then, for example, about 1.2 kW.

For conveying the printing plate 1 inside the heating zone 9 there are provided, beneath the conveying level of the printing plate 1, a few rows of rollers 10, for example spiked rollers, which bring about the continued conveying of the printing plate 1 without them having to be gripped from above.

After the heating zone 9 in the pass direction of the printing plate 1 there is provided a pair of squeezing rollers 11 which clean from the surface of the printing plate 1 detached layers and floating decoating liquid. Beneath the pair of squeezing rollers 11 there is provided a collecting trough 12 which collects these residues and conveys them to a connected container 13.

The distance between the pair of transport rollers 3 and the pair of squeezing rollers 11 is, for example, on the order of about 660 mm. The action zone of the heated decoating solution within the heating zone 9 is then about 500 mm. The spiked rollers 10 in the heating zone 9 take over the conveying of the printing plates 1, which are shorter than 660 mm, as soon as they have passed the pair 3 of conveying rollers. The spiked rollers 10 may produce scratches on the back of the printing plate 1. If these are not desired, the distance between the pair 3 of conveying rollers and the pair of squeezing rollers 11 must be shortened to about 410 mm so that even the shortest printing plate used in newspaper printing can be forcibly conveyed by the two pairs of rollers.

The pair of squeezing rollers 11 is followed by a second sensor 14 which, on registering the front edge of a printing plate 1 which is passing through, sets in operation a cleaning station 23 and a gumming station 24 which are connected downstream of the heating zone 9. The cleaning station 23 comprises a fresh-water rinsing system 15, a cleaning brush 16 and a pair of squeezing rollers 17 for cleaning, neutralizing and squeezing the cleaning water sprayed on from the printing plate surface. A drainpipe 26 is connected to the cleaning station 23.

In the gumming station 24 there is present a spraying nozzle 18 which sprays the gumming solution onto the printing plate surface. This is followed by a pair of rollers 19 which squeezes the excess gumming solution from the printing plate surface for collection in a container 27.

The rear edge of the printing plate 1 switches off the decoating device 21 by means of the second sensor 14 with a time delay so that the printing plate 1 can be unloaded onto an unloading table 28.

Before the device is switched off, the flat-jet nozzles 6 are, as mentioned previously, rinsed with water via the water connection 20 and the multiway valve 5 in order to prevent clogging of the orifices of said flat-jet nozzles 6.

The flat-jet nozzles 6 are spray nozzles which have a predetermined spraying angle of, for example, 90° and a spraying width predetermined thereby. Said nozzles deliver a flat-jet spread out in a fan shape. The spraying pressure of said flat-jet nozzles may be varied so that the quanity of decoating liquid sprayed on can be selected in accordance with the requirements for optimum decoating with a given printing plate pass speed and a fixed action zone within the heating zone.

According to the particular type of printing plate, only the container need be selected in each case from the containers 5a, 5b, 5c and connected to the multiway valve 5 which contains the decoating liquid matched to the type of printing plate.

Figure 2:
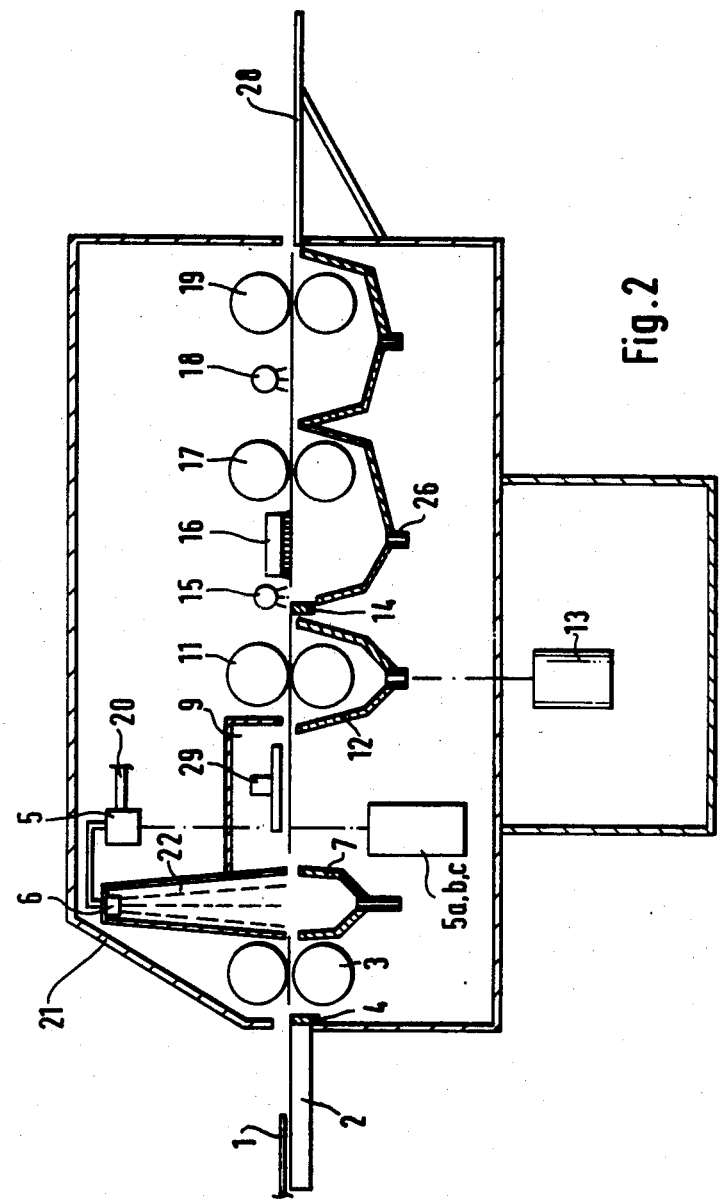
FIG. 2 is a schematic representation of an embodiment of the decoating device slightly modified with respect to FIG. 1.

FIG. 2 shows an embodiment of the decoating device 21 which is slightly modified compared with FIG. 1. Compared with the embodiment in FIG. 1, this embodiment is more compactly constructed and essentially contains the same components as FIG. 1, with the exception that no spiked rollers 10 are present in the heating zone 9. The printing plate 1 to be decoated is slid into the pair of conveying rollers 3 across the loading table 2. A first sensor 4, which is provided inside the housing wall of the decoating device 21, registers the front and rear edge of the printing plate 1 which is passing through. The decoating device 21 is switched on at the instant at which the first sensor 4 detects the front edge of the printing plate 1. From one of the containers 5a, 5b, 5c, which are arranged, for example, alongside each other transversely to the pass direction of the printing plate 1, the decoating solution or liquid is supplied via the multiway valve 5 and via a filter (not shown) to the flat-jet nozzle or nozzles 6 in the spraying section 22. The flat-jet nozzles 6 are switched on during the complete pass of the plate. After the printing plate 1 leaves the spraying section 22, it enters the heating zone 9 in which a heating system 29 provides for the selected temperature. As already mentioned, no spiked rollers are provided beneath the pass level of the printing plate 1 since the distance between the pair of conveying rollers 3 and the pair of squeezing rollers 11 at the end of the heating zone 9 is chosen in a manner such that even the shortest printing plate still used in newspaper printing can be conveyed through the heating zone 9 in a controlled manner by the two roller pairs 3 and 11.

The developer layer, largely detached, is squeezed off the surface of the printing plate 1 along with the residual decoating solution by the pair of squeezing rollers 11. The liquid is collected in the collecting trough 12 and conveyed to the container 13 situated beneath it. The subsequent washing of the printing plate surface by the fresh-water sprayed on by the fresh-water rinsing system 15 and the brushing of the printing plate surface by the cleaning brushes 16 cleans the printing plate 1 of layer residues which are squeezed off by the pair 17 of squeezing rollers and flow into the drainpipe 26. The gumming solution is applied via the spraying nozzle 18 and excess of it is squeezed off by the roller pair 19. The completely decoated printing plate 1 is unloaded onto the unloading table 28.

In the embodiment of the decoating device 28 shown in FIG. 3, a single sensor 4 is provided which is disposed in front of the first pair 3 of conveyor rollers. Since the printing plates 1 pass through the decoating device 21 with a predetermined pass speed, it is sufficient if a single sensor 4 registers the front and rear edge of each printing plate 1 and sequentially sets the various stations of the decoating device 21 in operation with a suitable time delay with respect to the particular registering instant of the front and back edge and also switches them off again. According to the type of printing plate to be decoated, the particular container of the decoating liquid suitable for the type of plate is selected before the printing plate 1 is loaded. One-way valves 36a, 36b, and 36c are situated in each case in the pipes from the individual containers 5a, 5b and 5c to the flat-jet nozzle or nozzles 6. After registering the front edge of an incoming printing plate 1 the sensor 4 opens, after a suitable time delay, the one-way valve in the pipe from the selected container in order to admit decoating liquid to the flat-jet nozzles 6. The overpressure in the containers 5a to 5c is, as in the case of the other embodiments, 1 to 3 bar. Of course, it is also possible that, just as in the case of the embodiments in FIGS. 1 and 2, a single multiway valve is used in this embodiment instead of the three one-way valves.

In contrast to the embodiments in FIGS. 1 and 2, the embodiment in FIG. 3 has a heating section which is split-up and which comprises a preheating zone 30 in front of the spraying section 22 and a main heating zone 32 after the spraying section 22. In the preheating zone 30 the printing plate 1 is heated to a temperature between about 20° and 30° C., and in the main heating zone 32, it is subsequently heated to a temperature of up to about 55° C. Both the preheating and also the main heating zone are provided with twin radiators 31 which heat up the printing plate 1 more rapidly and more uniformly than single radiators. A further pair of conveying rollers 33 which is provided between the preheating zone 30 and the spraying section 20, together with the pair of squeezing rollers 11 at the end of the main heating zone 32, ensure a reliable forcible propulsion of the printing plate 1 which is passing through.

In the spraying section 22 there is provided a cleaning trough 34 which is filled with a cleaning liquid, for example water, and which can be moved within the spraying region 22. For this purpose the cleaning trough 34 is connected to a hydraulic jack 35 which raises or lowers the cleaning trough 34 along an inclined line. The cleaning trough 34 is moved by the hydraulic jack 34 from a position outside the flat-jet of the one or more flat-jet nozzles 6 to a position in which the nozzle orifice of the flat-jet nozzles 6 is immersed in the cleaning liquid in the cleaning trough 34. This cleaning process is carried out every time before switching over from one of the containers 5a to 5c to another of said containers and also before the decoating device 21 is switched off in order to counteract the clogging of the orifices of the flat-jet nozzles 6 by the rinsing. The cleaning station 23 and the gumming station 24 of this embodiment are identical to the corresponding stations in the embodiments in FIGS. 1 and 2 and are therefore not described further.

What is claimed is:

1. A decoating device for precoated printing plates developed with liquid toner, comprising: pairs of conveying and squeezing rollers between which the printing plates pass through and a spray device in a spraying section for spraying decoating liquid onto the developed surface of the individual printing plates, wherein the spray device comprises a plurality of containers, filled with different decoating liquids, with the decoating liquids being under pressure, at least one flat-jet nozzle in a spraying section, said nozzle or nozzles being connected to the containers of decoating liquids via at least one valve, wherein a first sensor controls the opening times of the valves in accordance with the format of the printing plate passing through the decoating device, and wherein the spraying section is followed by a heating zone in which the decoating liquid film on the printing plate is heated to facilitate the decoating action.

2. A decoating device as claimed in llaim 1, wherein said spraying section additionally comprises a first trough, disposed beneath the spraying device, for collecting the decoating liquid sprayed over the printing plate and conveying said decoating liquid to a first collecting container connected to said first trough.

3. A decoating device as claimed in claim 1, wherein said valve comprises a multiway valve which is connected to a water connection which supplies water via said multiway valve to the flat-jet nozzle for rinsing the orifices in said nozzle.

4. A decoating device as claimed in claim 1, wherein said first sensor is provided in front of the pair of conveying rollers at the rear edge of a loading table for the printing plates, wherein said first sensor registers the front and rear edges of the incoming printing plate and, in each case, sends a signal to the multiway valve to open said valve with a time delay, and to close said valve without a time delay.

5. A decoating device as claimed in claim 1, wherein the decoating liquids in the plurality of containers are maintained under a pressure of from about 1 to 3 bar.

6. A decoating device as claimed in claim 1, wherein the printing plate is heated in the heating zone to a temperature of from about 25° to 55° C. in order to heat the film of decoating liquid on the printing plate.

7. A decoating device as claimed in claim 1, wherein the pair of squeezing rollers is provided dowstream of the heating zone, in the passing through direction, and where a second trough is disposed beneath said squeezing rollers for collecting layer residues of decoated light-sensitive layers and floating decoating liquids squeezed off the plate surface by said pair of squeezing rollers and conveying said decoated layers and decoating liquids to a second collecting container.

8. A decoating device as claimed in claim 7, wherein said pair of squeezing rollers is followed by a second sensor which, on registering the front edge of the printing plate passing through, sets a cleaning station and a gumming station in operation.

9. A decoating device as claimed in claim 8, wherein said cleaning station comprises a fresh-water rinsing system, a cleaning brush, a pair of squeezing rollers, and a drainpipe for cleaning, neutralizing, and squeezing clean water off the printing plate surface and conveying said water off as wastewater.

10. A decoating device as claimed in claim 8, wherein said gumming station comprises spray nozzle for applying a gumming solution to the printing plate and a pair of rollers for squeezing excess gumming solution off the printing plate.

11. A decoating device as claimed in claim 1, wherein all of the containers of the decoating liquids are connected to a single multiway valve.

12. A decoating device as claimed in claim 1, wherein each container of the decoating liquids is connected to at least one flat-jet nozzle via a one-way valve.

13. A decoating device as claimed in claim 1, wherein a single sensor controls the flat-jet nozzles, the cleaning and gumming stations, and the remaining operations of the decoating device.

14. A decoating device as claimed in claim 1, further comprising a preheating zone, in front of the spraying section, and a main heating zone, after the spraying section.

15. A decoating device as claimed in claim 14, wherein the printing plates are heated in the preheating zone to a temperature of from about 20° to 30° C., and in the main heating zone to a temperature of up to 55° C.

16. A decoating device as claimed in claim 14, wherein the preheating and main heating zones each further comprise twin radiators.

17. A decoating device as claimed in claim 14, further comprising one pair of conveying rollers in front of, and one pair of conveying rollers after, the preheating zone.

18. A decoating device as claimed in claim 1, further comprising a cleaning trough, filled with a cleaning liquid, which is movably provided within the spraying section, and whereby said cleaning trough can be moved by a hydraulic jack from a position outside the flat-jet of the flat-jet nozzles to a position in which the orifices of the flat-jet nozzles are immersed in the cleaning liquid in said cleaning trough.

19. A decoating device as claimed in claim 18, wherein said cleaning trough can be raised and lowered by a hydraulic jack along an inclined line.

* * * * *